US012040768B2

(12) United States Patent
Toujo

(10) Patent No.: US 12,040,768 B2
(45) Date of Patent: Jul. 16, 2024

(54) CIRCUIT DEVICE AND FILTER CIRCUIT

(71) Applicant: Murata Manufacturing Co., Ltd., Nagaokakyo (JP)

(72) Inventor: Atsushi Toujo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 238 days.

(21) Appl. No.: 17/715,098

(22) Filed: Apr. 7, 2022

(65) Prior Publication Data

US 2022/0231653 A1 Jul. 21, 2022

Related U.S. Application Data

(63) Continuation of application No. PCT/JP2020/041687, filed on Nov. 9, 2020.

(30) Foreign Application Priority Data

Dec. 13, 2019 (JP) ................................ 2019-225302

(51) Int. Cl.

| | |
|---|---|
| ***H03H 7/01*** | (2006.01) |
| ***H01F 17/04*** | (2006.01) |
| ***H01F 27/28*** | (2006.01) |
| ***H03H 7/09*** | (2006.01) |
| *H03H 1/00* | (2006.01) |

(52) U.S. Cl.

CPC ......... *H03H 7/0115* (2013.01); *H01F 17/045* (2013.01); *H01F 27/2823* (2013.01); *H03H 7/0138* (2013.01); *H03H 7/09* (2013.01); *H01F 2017/046* (2013.01); *H03H 2001/0085* (2013.01)

(58) Field of Classification Search

CPC ......... H03H 2001/0085; H03H 7/0115; H03H 7/09

USPC ........................................ 333/175, 177, 185

See application file for complete search history.

(56) References Cited

U.S. PATENT DOCUMENTS

| | | | |
|---|---|---|---|
| 2009/0266900 | A1 | 10/2009 | Ikemoto et al. |
| 2017/0323861 | A1 | 11/2017 | Ishiwata |
| 2019/0123553 | A1 | 4/2019 | Ueki |

FOREIGN PATENT DOCUMENTS

| | | | |
|---|---|---|---|
| JP | 2001-160728 | A | 6/2001 |
| JP | 2008-167157 | A | 7/2008 |
| JP | 2010-135602 | A | 6/2010 |
| JP | 2017-201667 | A | 11/2017 |
| WO | 2009/011400 | A1 | 1/2009 |
| WO | 2018/066578 | A1 | 4/2018 |

OTHER PUBLICATIONS

Official Communication issued in International Patent Application No. PCT/JP2020/041687, mailed on Jan. 19, 2021.

*Primary Examiner* — Rakesh B Patel

(74) *Attorney, Agent, or Firm* — Keating & Bennett, LLP

(57) ABSTRACT

A circuit device includes a substrate, and a wiring pattern and a coil component on the substrate. The wiring pattern includes a first land electrode connected to a first electrode of the coil component and a second land electrode connected to a second electrode of the coil component. The wiring pattern includes a wiring line electrically connected to the land electrode at a position shifted along a first side surface from a center of the first side surface by a shifting value and a wiring line electrically connected to the land electrode at a position shifted along a second side surface from a center of the second side surface by a shifting value.

18 Claims, 11 Drawing Sheets

10A 2 81 4d 1 4b 4a 70 60 Y X 71 4c 20 61 80

1 C 100 4a L1 4c L2 4b C1a C1 L3 GND

CIRCUIT DEVICE AND FILTER CIRCUIT

CROSS REFERENCE TO RELATED APPLICATIONS

This application claims the benefit of priority to Japanese Patent Application No. 2019-225302 filed on Dec. 13, 2019 and is a Continuation Application of PCT Application No. PCT/JP2020/041687 filed on Nov. 9, 2020. The entire contents of each application are hereby incorporated herein by reference.

BACKGROUND OF THE INVENTION

1. Field of the Invention

The present disclosure relates to a circuit device and a filter circuit.

2. Description of the Related Art

In an electronic device, noise suppression is generally performed using a filter circuit. Examples of the filter circuit used for the noise suppression include an EMI (Electro-Magnetic Interference) suppression filter. The EMI suppression filter allows a necessary component of a current flowing through a conductor to pass through and removes an unnecessary component thereof. Further, it is known that since the filter circuit uses a capacitor as a capacitance element, a noise suppression effect is lowered by equivalent series inductance (ESL) that is a parasitic inductance of the capacitor.

A technique is known in which the equivalent series inductance (ESL) of a capacitor is canceled with negative inductance generated by magnetically coupling two coils and a frequency range of a noise suppression effect of a filter circuit is widened (Japanese Unexamined Patent Application Publication No. 2001-160728, for example).

In order to cancel the equivalent series inductance (ESL) of the capacitor, it is necessary to adjust mutual inductance M of the two coils. In an LC filter disclosed in Japanese Unexamined Patent Application Publication No. 2001-160728, since two coils are provided in a magnetic body, a large mutual inductance M may be obtained. However, in order to adjust the mutual inductance M to match the equivalent series inductance (ESL) to be canceled, it is necessary to change the magnetic coupling of the two coils or the like, and thus it is difficult to adjust the mutual inductance M.

SUMMARY OF THE INVENTION

Preferred embodiments of the present disclosure provide circuit devices and filter circuits that are each able to adjust mutual inductance of two coils.

A circuit device according to a preferred embodiment of the present invention includes a substrate, a wiring pattern on the substrate, and a coil component on the substrate. The coil component includes a first coil and a second coil in a multilayer body such that coil surfaces thereof face each other in a lamination direction, and the coil component is mounted such that the coil surfaces thereof are parallel or substantially parallel to a surface of the substrate. The wiring pattern includes a first electrode portion connected to an input terminal of the coil component and provided along a first side surface of the multilayer body on which the input terminal is provided, a second electrode portion connected to an output terminal of the coil component and provided along a second side surface of the multilayer body, the second side surface being opposed to the first side surface, a first wiring portion electrically connected to the first electrode portion at a position shifted along the first side surface from a center of the first side surface by a first distance, and a second wiring portion electrically connected to the second electrode portion at a position shifted along the second side surface from a center of the second side surface by a second distance.

A circuit device according to a preferred embodiment of the present invention includes a substrate, a wiring pattern on the substrate, and a coil component on the substrate. The coil component includes a first coil and a second coil in a multilayer body such that coil surfaces thereof face each other in a lamination direction, and the coil component is mounted such that the coil surfaces thereof are parallel or substantially parallel to a surface of the substrate. The wiring pattern includes a first electrode portion connected to an input terminal of the coil component and provided along a first side surface of the multilayer body on which the input terminal is provided, a second electrode portion connected to an output terminal of the coil component and provided along a second side surface of the multilayer body, the second side surface being opposed to the first side surface, a first wiring portion not electrically connected to the first electrode portion, and a second wiring portion not electrically connected to the second electrode portion. The first electrode portion includes a first connection portion at a position shifted in a first direction along the first side surface from a center of the first side surface by a first distance, and a second connection portion at a position shifted in a second direction opposite to the first direction along the first side surface from the center of the first side surface by the first distance. The second electrode portion includes a third connection portion at a position shifted in the first direction along the second side surface from a center of the second side surface by a second distance, and a fourth connection portion at a position shifted in the second direction along the second side surface from the center of the second side surface by the second distance. The first wiring portion includes a first end portion extending to a position facing the first connection portion, and a second end portion extending to a position facing the second connection portion. The second wiring portion includes a third end portion extending to a position facing the third connection portion, and a fourth end portion extending to a position facing the fourth connection portion. The circuit device includes a first connection element that electrically connects between the first connection portion and the first end portion, or between the second connection portion and the second end portion, and a second connection element that electrically connects between the third connection portion and the third end portion, or between the fourth connection portion and the fourth end portion.

A filter circuit according to a preferred embodiment of the present invention includes a circuit device according to a preferred embodiment of the present invention and a capacitor connected to an electrode between the first coil and the second coil of the coil component.

According to each of the preferred embodiments of the present invention, mutual inductance of the coil component is able to be adjusted by making a current flow along the side surface of the multilayer body through the wiring pattern.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, circuit devices and filter circuits according to preferred embodiments will be described with reference to the drawings.

Preferred Embodiment 1

Figure 1:
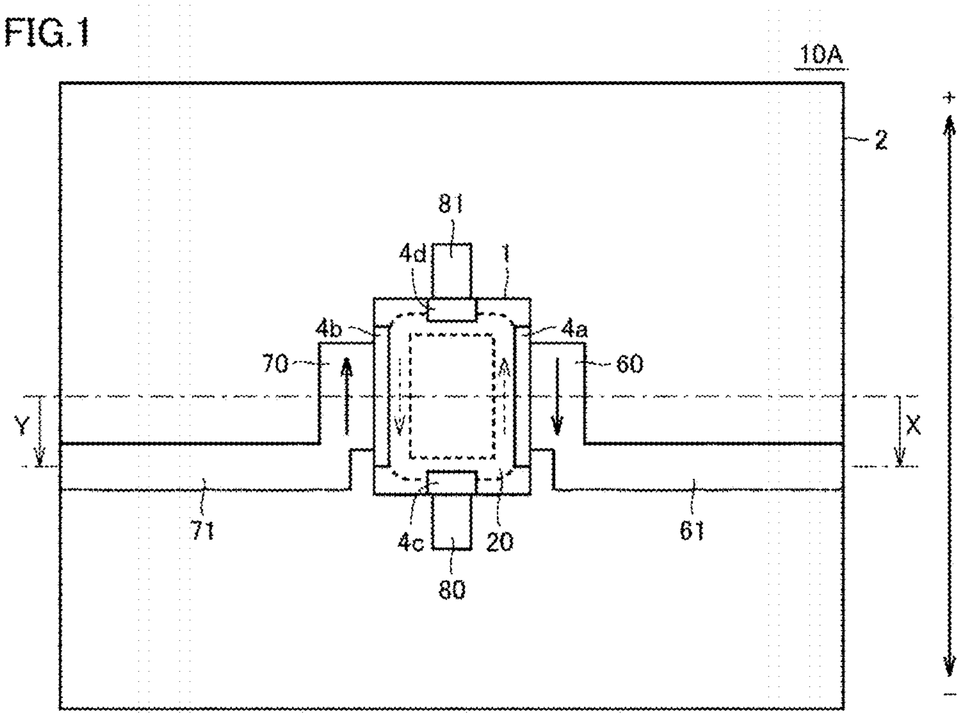
FIG. 1 is a plan view of a circuit device according to Preferred Embodiment 1 of the present invention.

First, a circuit device 10A according to Preferred Embodiment 1 of the present invention will be described with reference to the drawings. FIG. 1 is a plan view of the circuit device 10A according to Preferred Embodiment 1. A coil component 1 is mounted on a surface of a substrate 2 of the circuit device 10A. Land electrodes 60, 70, 80, and 81 on which the coil component 1 is surface-mounted are provided on the surface of the substrate 2. The land electrode 60 is connected to an electrode 4*a* that is an output terminal to output a current from the coil component 1, and the land electrode 70 is connected to an electrode 4*b* that is an input terminal to input the current to the coil component 1. The direction of the current flowing through the coil component 1 may be changed such that the current is inputted through the electrode 4*a* as the input terminal and is outputted through the electrode 4*b* as the output terminal.

The land electrode 80 is connected to an electrode 4*c* of the coil component 1, and the land electrode 81 is connected to an electrode 4*d* of the coil component 1. The electrode 4*c* described later is between a coil L1 and a coil L2 included in the coil component 1 and is connected to the coil L1 and the coil L2. The electrode 4*d* is not connected to the coil L1 or the coil L2.

A wiring line 61 is connected to the land electrode 60 as illustrated in FIG. 1. The wiring line 61 is connected to the land electrode 60 at a position shifted in a minus direction from the center of the side surface (first side surface on which the electrode 4*a* is provided) of the coil component 1 by a shifting value X (first distance). A dashed-and-dotted line in FIG. 1 represents the center of the side surface of the coil component 1 and the wiring line, and a lower side in the drawing is defined as the minus (negative) direction and an upper side in the drawing is defined as a plus (positive) direction.

A wiring line 71 is connected to the land electrode 70 as illustrated in FIG. 1. The wiring line 71 is connected to the land electrode 70 at a position shifted in the minus direction from the center of the side surface (second side surface on which the electrode 4*b* is provided) of the coil component 1 by a shifting value Y (second distance). In the circuit device 10A, the shifting value X (first distance) and the shifting value Y (second distance) are the same or substantially the same, and the shifts of the wiring line 61 and the wiring line 71 may be represented only by the shifting value X (first distance).

The substrate 2 is formed by laminating multiple insulation layers and is made of, for example, low-temperature co-fired ceramics, glass epoxy resin, or the like. Each of the land electrodes 60, 70, 80, and 81, and the wiring lines 61 and 71 provided on the surface of the substrate 2 is a wiring pattern and is made of, for example, a metal such as Cu, Ag, or Al used as an electrode in many cases.

Figure 2:
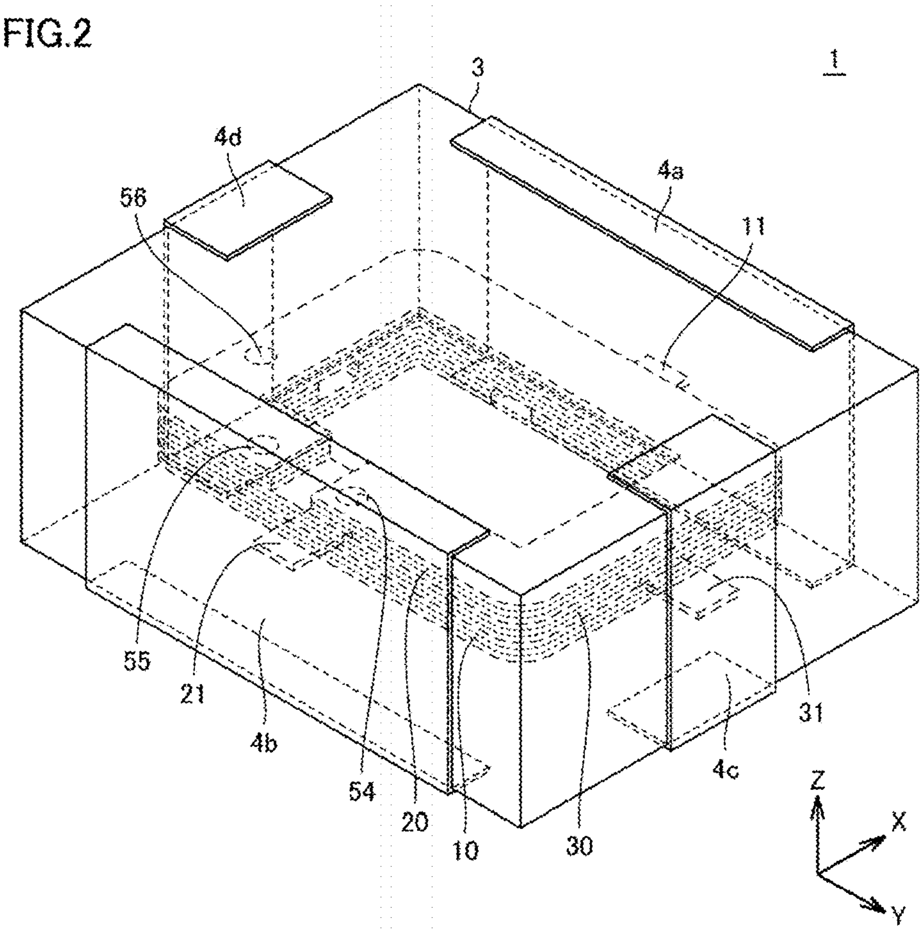
FIG. 2 is a perspective view of a coil component according to Preferred Embodiment 1 of the present invention.

The coil component 1 is a transformer coil and includes the coil L1 (first coil) and the coil L2 (second coil) provided in a multilayer body such that the coil surfaces thereof face each other in the lamination direction. Further, the coil component 1 is mounted such that the coil surfaces thereof are parallel or substantially parallel to the surface of the substrate 2. The configuration of the coil component 1 will be described with reference to the drawings. FIG. 2 is a perspective view of the coil component according to Preferred Embodiment 1. Here, in FIG. 2, a short side direction of the coil component 1 is defined as an X direction, a longitudinal direction is defined as a Y direction, and a height direction is defined as a Z direction. Further, the lamination direction of the substrates is the Z direction, and the direction of the arrow indicates the upper layer direction.

As illustrated in FIG. 2, the coil component 1 is configured of a multilayer body 3 (ceramic element body) made of ceramic layers in which multiple substrates (ceramic green sheets) are laminated. A wiring line of the coil is provided on the substrate. The multilayer body 3 includes a pair of main surfaces opposed to each other and side surfaces connecting the main surfaces. In parallel or substantially in parallel to the main surface of the multilayer body 3, multiple first wiring patterns 10, multiple third wiring patterns 30, and multiple second wiring patterns 20 are laminated in this order from the bottom to form the coil L1 and the coil L2.

The side surfaces of the multilayer body 3 include a first side surface and a second side surface on the long sides and a third side surface and a fourth side surface on the short sides. The first side surface is the side surface on which the electrode 4*a* (first electrode) is provided, the second side surface is the side surface on which the electrode 4*b* (second electrode) is provided, the third side surface is the side surface on which the electrode 4*c* (third electrode) is provided, and the fourth side surface is the side surface on which the electrode 4*d* is provided.

In the coil component 1, the multiple first wiring patterns 10, the multiple second wiring patterns 20, and the multiple third wiring patterns 30 defining the coils L1 and L2 are disposed inside the multilayer body 3. A portion of the multiple third wiring patterns 30 defines the coil L1 and the rest of the multiple third wiring patterns 30 defines the coil L2. That is, the multiple third wiring patterns 30 are a common portion of the coils L1 and L2. Including a common portion of the coils L1 and L2 as in the multiple third wiring patterns 30 makes it possible to reduce variations in magnetic coupling between the coil L1 and the coil L2. The coil shapes of the coils L1 and L2 are line-symmetrical or substantially line-symmetrical relative to the electrode 4*c*.

Among the multiple first wiring patterns 10 laminated in the lower layer, an end portion 11 of the first wiring pattern 10 in the lowest layer is electrically connected to the electrode 4*a*. The multiple first wiring patterns 10 are electrically connected to each other by a via conductor (first via conductor) not illustrated. The first via conductor may include one via conductor or multiple via conductors. It is sufficient that at least one of the multiple first wiring patterns 10 is electrically connected to the electrode 4*a*.

Among the multiple third wiring patterns 30 laminated in the middle layer, an end portion 31 of the third wiring pattern 30 in the lowest layer is electrically connected to the electrode 4*c*. The multiple third wiring patterns 30 are electrically connected to each other using a via conductor (seventh via conductor) not illustrated. Note that the seventh via conductor may include one via conductor or multiple via conductors. It is sufficient that at least one of the multiple third wiring patterns 30 is electrically connected to the electrode 4*c*.

The third wiring patterns 30 laminated in the middle layer are electrically connected to the first wiring patterns 10 in the lower layer using via conductors (second via conductor and third via conductor) not illustrated. The second via conductor provided in the first wiring pattern 10 and the third via conductor provided in the first wiring pattern 10 are located on different side surface sides of the multilayer body 3. Specifically, as illustrated in FIG. 2, the second via conductor provided in the first wiring pattern 10 is located on the first side surface side on the long side, and the first side surface side is different from the fourth side surface side on the short side on which the third via conductor provided in first wiring pattern 10 is located.

Among the multiple second wiring patterns 20 laminated in the upper layer, an end portion 21 of the second wiring pattern 20 in the lowest layer is electrically connected to the electrode 4*b*. The multiple second wiring patterns 20 are electrically connected to each other using a via conductor 54 (fourth via conductor). Note that the via conductor 54 may include one via conductor or multiple via conductors. It is sufficient that at least one of the multiple second wiring patterns 20 is electrically connected to the electrode 4*b*.

The second wiring patterns 20 laminated on the upper layer are electrically connected to the third wiring patterns 30 in the middle layer using via conductors 55 and 56. Each of the via conductors 55 and 56 may include one via conductor or multiple via conductors. The via conductors 55 and 56 are electrically connected to the respective multiple second wiring patterns 20 and multiple third wiring patterns 30. Further, the via conductor 55 (fifth via conductor) provided in the second wiring pattern 20 and the via conductor 56 (sixth via conductor) provided in the second wiring pattern 20 are located on different side surface sides of the multilayer body 3. Specifically, as illustrated in FIG. 2, the second wiring pattern 20 to which the via conductor 55 is provided is located on the second side surface side on the long side, and the second side surface side is different from the fourth side surface side on the short side on which the second wiring pattern 20 to which the via conductor 56 is provided is located.

In the coil component 1, the mutual inductance M between the coil L1 and the coil L2 is determined as a constant value by providing the configuration illustrated in FIG. 2. However, there is a case that adjusting the mutual inductance M between the coil L1 and the coil L2 is required without changing the coil component 1. Therefore, in Preferred Embodiment 1, the mutual inductance M of the coil component 1 is adjusted with the wiring pattern provided on the substrate 2 on which the coil component 1 is mounted.

Returning to FIG. 1, the wiring line 61 is shifted in the minus direction from the center of the side surface of the coil component 1 by the shifting value X and is connected to the land electrode 60. This makes the current flowing through the land electrode 60 flow along the side surface of the coil component 1 toward the wiring line 61, as indicated by a solid line arrow in FIG. 1. The current flowing through the coil component 1 (the current flowing through the second wiring pattern 20, for example) flows in the direction opposite or substantially opposite to that of the current flowing through the land electrode 60, as indicated by a dashed line arrow in FIG. 1. As a result, the magnetic field generated by the current flowing through the coil component 1 is weakened by the magnetic field generated by the current flowing through the land electrode 60.

Further, the wiring line 71 is shifted in the minus direction from the center of the side surface of the coil component 1 by the shifting value Y (=the shifting value X) and is connected to the land electrode 70. This makes the current flowing through the land electrode 70 flow along the side surface of the coil component 1 away from the wiring line 71, as indicated by a solid line arrow in FIG. 1. The current flowing through the coil component 1 (the current flowing through the second wiring pattern 20, for example) flows in the direction opposite or substantially opposite to that of the current flowing through the land electrode 70, as indicated by a dashed line arrow in FIG. 1. As a result, the magnetic field generated by the current flowing through the coil component 1 is weakened by the magnetic field generated by the current flowing through the land electrode 70.

Thus, the magnetic field generated in the coil L1 and the coil L2 of the coil component 1 is weakened by the current flowing through the land electrode 60 and the land electrode 70. This makes it possible to reduce the mutual inductance M between the coil L1 and the coil L2. That is, the mutual inductance M between the coil L1 and the coil L2 may be adjusted by changing the shifting value of the wiring line 61 and the wiring line 71, which are connected to the land electrode 60 and the land electrode 70, from the center of the side surface of the coil component 1.

Figure 3:
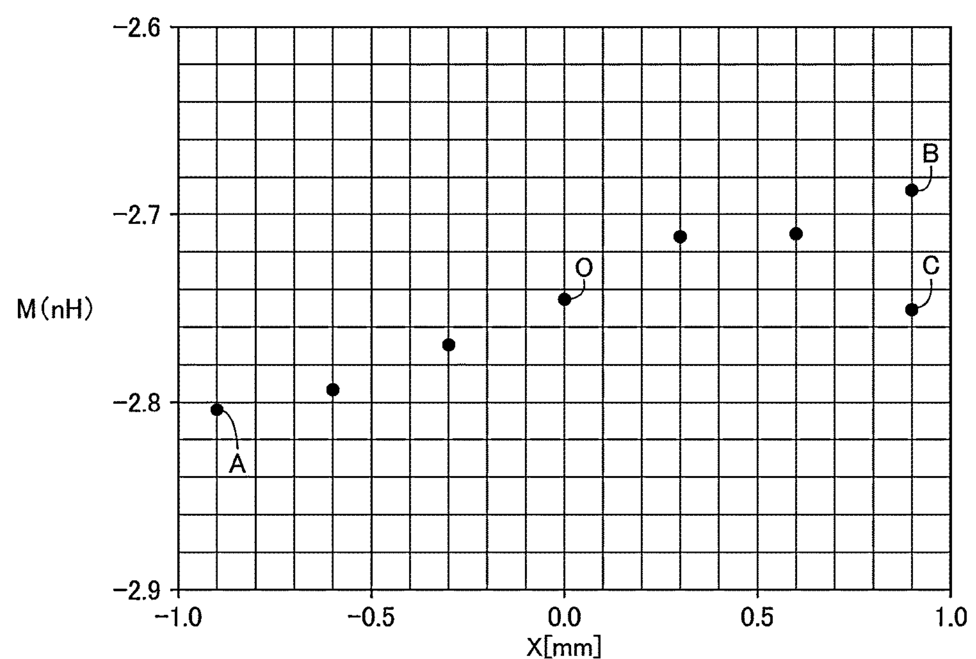
FIG. 3 is a graph illustrating a relationship between mutual inductance of the circuit device according to Preferred Embodiment 1 of the present invention and a shifting value of a wiring portion.

FIG. 3 is a graph illustrating the relationship between the mutual inductance of the circuit device according to Preferred Embodiment 1 and the shifting value of the wiring portion. The graph in FIG. 3 has a horizontal axis representing the shifting value X (mm) and a vertical axis representing the mutual inductance M (nH) between the coil L1 and the coil L2. Further, the graph in FIG. 3 describes a circuit device in which the shifting value X of the wiring line 61 and the shifting value Y of the wiring line 71 are the same or substantially the same. A point A in FIG. 3 is the mutual inductance M of the coil component 1 in the circuit device 10A. The mutual inductance M of the coil component 1 in the circuit device when the shifting value X is 0 (zero) is indicated by a point O. As indicated by the point A, by setting the shifting value X to about −0.9 mm, for example, the mutual inductance M may be reduced by approximately 0.06 nH (approximately 2%) relative to the point O.

Figure 4A:
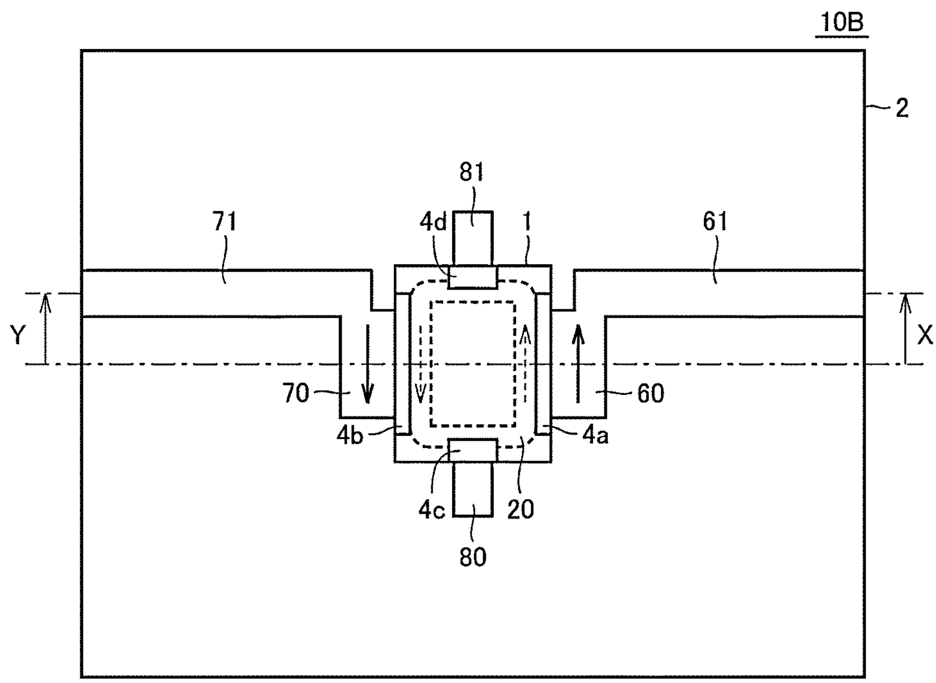
FIGS. 4A and 4B are plan views of another pattern of the circuit device according to Preferred Embodiment 1 of the present invention.
Figure 4B:
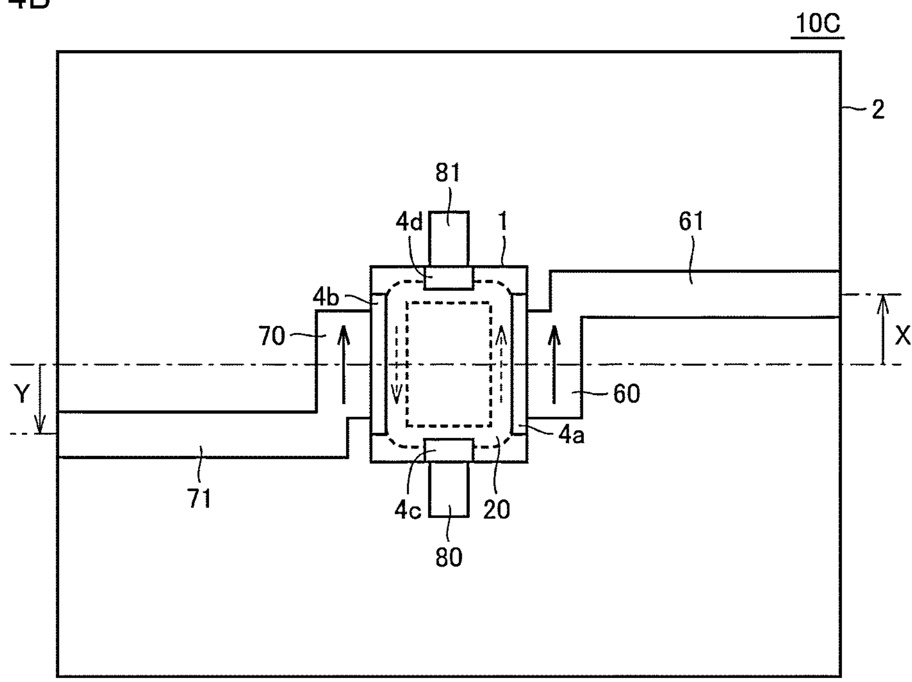

FIGS. 4A and 4B are plan views of another pattern of the circuit device according to Preferred Embodiment 1. FIG. 4A illustrates a circuit device 10B in which the wiring line 61 is shifted in the plus direction from the center of the side surface of the coil component 1 and is connected to the land electrode 60, and the wiring line 71 is shifted in the plus direction from the center of the side surface of the coil component 1 and is connected to the land electrode 70. FIG. 4B illustrates a circuit device 10C in which the wiring line 61 is shifted in the plus direction from the center of the side surface of the coil component 1 and is connected to the land electrode 60, and the wiring line 71 is shifted in the minus direction from the center of the side surface of the coil component 1 and is connected to the land electrode 70. In the circuit device illustrated in FIGS. 4A and 4B, the same or corresponding components as those of the circuit device illustrated in FIG. 1 are denoted by the same reference signs, and detailed description thereof will not be repeated. Further, the shifting values X and Y and the shifting directions of the wiring lines 61 and 71 in FIGS. 4A and 4B are defined as the same or substantially the same shifting values X and Y and the shifting directions of the wiring lines 61 and 71 in FIG. 1.

In the circuit device 10B in FIG. 4A, the wiring line 61 is shifted in the plus direction from the center of the side surface of the coil component 1 and is connected to the land electrode 60. This makes the current flowing through the land electrode 60 flow along the side surface of the coil component 1 toward the wiring line 61, as indicated by a solid line arrow. Meanwhile, the current flowing through the coil component 1 (the current flowing through the second wiring pattern 20, for example) flows parallel or substantially parallel to the current flowing through the land electrode 60, as indicated by a dashed line arrow in FIG. 4A. As a result, the magnetic field generated by the current flowing through the coil component 1 is strengthened by the magnetic field generated by the current flowing through the land electrode 60.

Further, the wiring line 71 is shifted in the plus direction from the center of the side surface of the coil component and is connected to the land electrode 70. This makes the current flowing through the land electrode 70 flow along the side surface of the coil component 1 away from the wiring line 71, as indicated by a solid line arrow in FIG. 4A. Meanwhile, the current flowing through the coil component 1 (the current flowing through the second wiring pattern 20, for example) flows parallel or substantially parallel to the current flowing through the land electrode 70, as indicated by a dashed line arrow in FIG. 4A. As a result, the magnetic field generated by the current flowing through the coil component 1 is strengthened by the magnetic field generated by the current flowing through the land electrode 70.

A point B in FIG. 3 is the mutual inductance M of the coil component 1 in the circuit device 10B. As indicated by the point B, by setting the shifting value X to about +0.9 mm, for example, the mutual inductance M may be increased by approximately 0.06 nH (approximately 2%) relative to the point O.

In the circuit device 10C in FIG. 4B, the wiring line 61 is shifted in the plus direction from the center of the side surface of the coil component 1 and is connected to the land electrode 60. This makes the current flowing through the land electrode 60 flow along the side surface of the coil component 1 toward the wiring line 61, as indicated by a solid line arrow. Meanwhile, the current flowing through the coil component 1 (the current flowing through the second wiring pattern 20, for example) flows parallel or substantially parallel to the current flowing through the land electrode 60, as indicated by a dashed line arrow in FIG. 4B. As a result, the magnetic field generated by the current flowing through the coil component 1 is strengthened by the magnetic field generated by the current flowing through the land electrode 60.

Whereas, the wiring line 71 is shifted in the minus direction from the center of the side surface of the coil component and is connected to the land electrode 70. This makes the current flowing through the land electrode 70 flow along the side surface of the coil component 1 away from the wiring line 71, as indicated by a solid line arrow in FIG. 4B. The current flowing through the coil component 1 (the current flowing through the second wiring pattern 20, for example) flows in the direction opposite or substantially opposite to that of the current flowing through the land electrode 70, as indicated by a dashed line arrow in FIG. 4B. As a result, the magnetic field generated by the current flowing through the coil component 1 is weakened by the magnetic field generated by the current flowing through the land electrode 70.

A point C in FIG. 3 is the mutual inductance M of the coil component 1 in the circuit device 10C. As indicated by the point C, for example, by setting the shifting value X of the wiring line 61 to about +0.9 mm and the shifting value X of the wiring line 71 to about −0.9 mm (the point C is plotted only with the shifting value X of the wiring line 61 in the graph of FIG. 3), the mutual inductance M is the same or substantially the same as that in the point O. That is, since the magnetic field on the land electrode 60 side is strengthened and the magnetic field on the land electrode 70 side is weakened, the circuit device 10C, as a whole, has mutual inductance M equivalent to that of a circuit device in which the shifting value X is approximately 0 (zero).

Figure 5A:
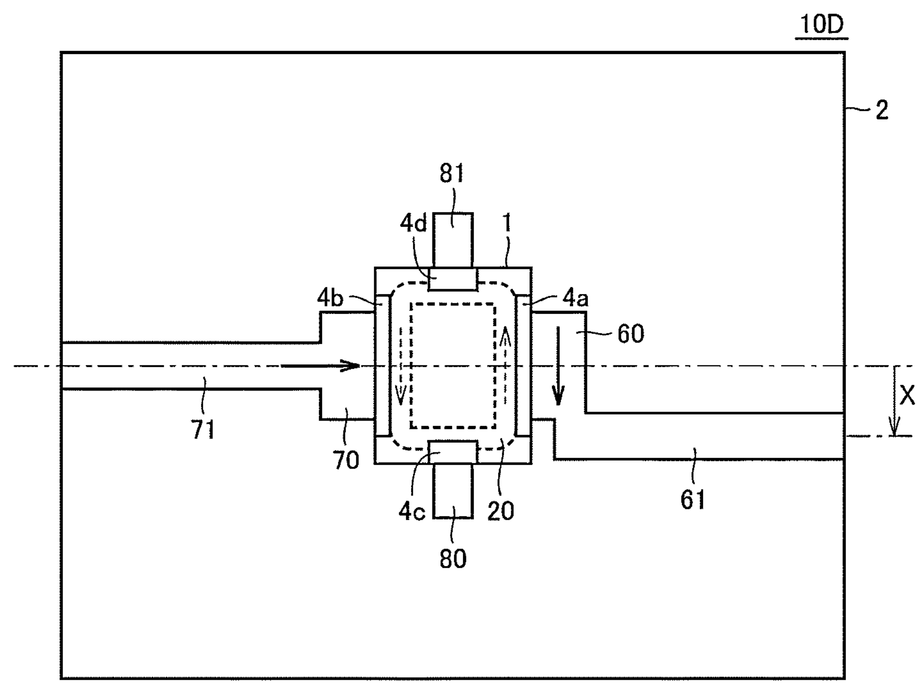
FIGS. 5A and 5B are plan views of another pattern of the circuit device according to Preferred Embodiment 1 of the present invention.
Figure 5B:
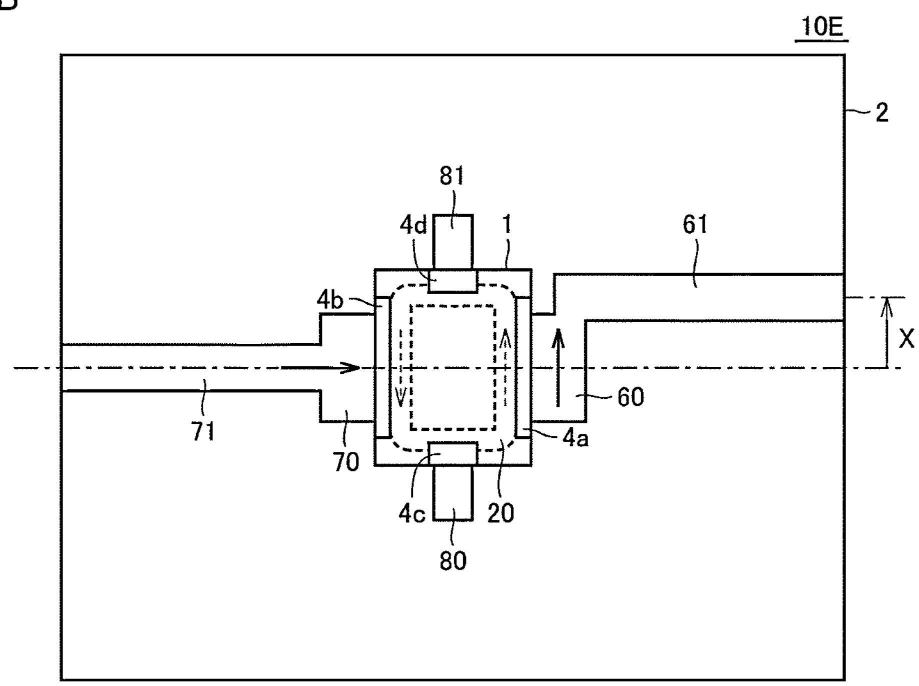

In the circuit device, the shifting value X of the wiring line 61 and the shifting value Y of the wiring line 71 need not be the same or substantially the same and may be different from each other. For example, acceptable is a case that the shifting value X (first distance) of the wiring line 61 is about −0.9 mm and the shifting value Y (second distance) of the wiring line 71 is about +0.5 mm. FIGS. 5A and 5B are plan views of still another pattern of the circuit device according to Preferred Embodiment 1. FIG. 5A illustrates a circuit device 10D in which the wiring line 61 is shifted in the minus direction from the center of the side surface of the coil component 1 and is connected to the land electrode 60 and the wiring line 71 is connected to the land electrode 70 at the center of the side surface of the coil component 1. FIG. 5B illustrates a circuit device 10E in which the wiring line 61 is shifted in the plus direction from the center of the side surface of the coil component 1 and is connected to the land electrode 60 and the wiring line 71 is connected to the land electrode 70 at the center of the side surface of the coil component 1. In the circuit device illustrated in FIGS. 5A and 5B, the same or corresponding components as those of the circuit device illustrated in FIG. 1 are denoted by the same reference signs, and detailed description thereof will not be repeated. Further, the shifting values X and Y and the shifting directions of the wiring lines 61 and 71 in FIGS. 5A and 5B are defined as the same or substantially the same as the shifting values X and Y and the shifting directions of the wiring lines 61 and 71 in FIG. 1.

In the circuit device 10D in FIG. 5A, the wiring line 61 is shifted in the minus direction from the center of the side surface of the coil component 1 and is connected to the land electrode 60. This makes the current flowing through the land electrode 60 flow along the side surface of the coil component 1 toward the wiring line 61, as indicated by a solid line arrow. Whereas, the current flowing through the coil component 1 (the current flowing through the second wiring pattern 20, for example) flows in the direction opposite or substantially opposite to that of the current flowing through the land electrode 60, as indicated by a dashed line arrow in FIG. 5A. As a result, the magnetic field generated by the current flowing through the coil component 1 is weakened by the magnetic field generated by the current flowing through the land electrode 60.

Further, the wiring line 71 is connected to the land electrode 70 at the center of the side surface of the coil component 1. This makes the current flowing through the land electrode 70 flow orthogonal or substantially orthogonal to the side surface of the coil component 1, as indicated by a solid line arrow in FIG. 5A. Whereas, the current flowing through the coil component 1 (the current flowing through the second wiring pattern 20, for example) flows orthogonal or substantially orthogonal to the current flowing through the land electrode 70, as indicated by a dashed line arrow in FIG. 5A. As a result, the magnetic field generated by the current flowing through the coil component 1 is not affected by the magnetic field generated by the current flowing through the land electrode 70. Accordingly, the mutual inductance M of the coil component 1 in the circuit device 10D is larger than the mutual inductance M of the coil component 1 in the circuit device 10A and is smaller than the mutual inductance M of the coil component 1 in the circuit device in which the shifting value X is approximately 0 (zero).

In the circuit device 10E in FIG. 5B, the wiring line 61 is shifted in the plus direction from the center of the side surface of the coil component 1 and is connected to the land electrode 60. This makes the current flowing through the land electrode 60 flow along the side surface of the coil component 1 toward the wiring line 61, as indicated by a solid line arrow. Meanwhile, a current flowing through the coil component 1 (the current flowing through the second wiring pattern 20, for example) flows parallel or substantially parallel to the current flowing through the land electrode 60, as indicated by a dashed line arrow in FIG. 5B. As a result, the magnetic field generated by the current flowing through the coil component 1 is strengthened by the magnetic field generated by the current flowing through the land electrode 60.

Whereas, the wiring line 71 is connected to the land electrode 70 at the center of the side surface of the coil component 1. This makes the current flowing through the land electrode 70 flow orthogonal or substantially orthogonal to the side surface of the coil component 1, as indicated by a solid line arrow in FIG. 5B. The current flowing through the coil component (the current flowing through the second wiring pattern 20, for example) flows orthogonal or substantially orthogonal to the current flowing through the land electrode 70, as indicated by a dashed line arrow in FIG. 5B. As a result, the magnetic field generated by the current flowing through the coil component 1 is not affected by the magnetic field generated by the current flowing through the land electrode 70. Accordingly, the mutual inductance M of the coil component 1 in the circuit device 10E is smaller than the mutual inductance M of the coil component 1 in the circuit device 10B and is larger than the mutual inductance M of the coil component 1 in the circuit device in which the shifting value X is approximately 0 (zero).

Figure 6:
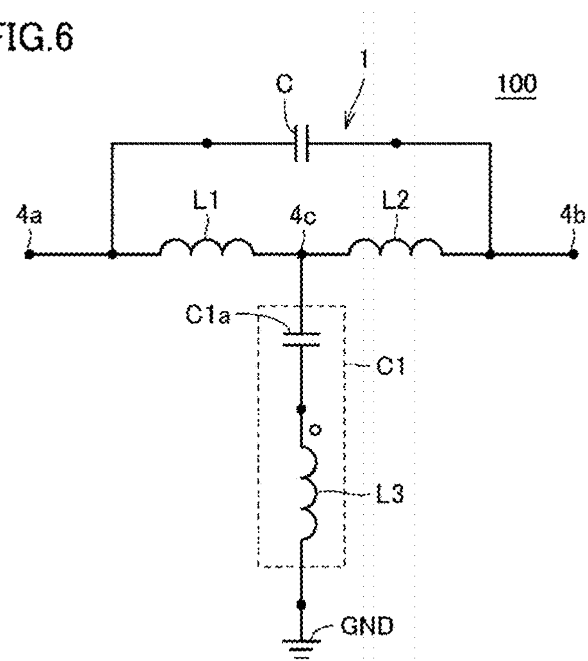
FIG. 6 is a circuit diagram of a filter circuit including the coil component according to Preferred Embodiment 1 of the present invention.

In the circuit device 10A to the circuit device 10E described above, the coil component 1 is mounted on the substrate 2. However, a filter circuit may be configured by mounting a capacitor C1 on the land electrode 80. FIG. 6 is a circuit diagram of a filter circuit including the coil component according to Preferred Embodiment 1.

A filter circuit 100 is an EMI suppression filter and is a third order T-type LC filter circuit, for example. The circuit device 10A, the circuit device 10B, the circuit device 10C, the circuit device 10D, or the circuit device 10E is used in the filter circuit 100. In the following Preferred Embodiment 1, the third order T-type LC filter circuit will be described as a configuration of the filter circuit 100, but a multilayer substrate having a similar configuration may be applied to a fifth order T-type LC filter circuit or a higher-order T-type LC filter circuit. First, as illustrated in FIG. 6, the filter circuit 100 includes the capacitor C1, electrodes 4*a*, 4*b*, and 4*c*, the coil L1 (first coil), and the coil L2 (second coil).

One end of the capacitor C1 is connected to the electrode 4*c*, and the other end is connected to a GND wiring as illustrated in FIG. 6. Note that, the capacitor C1 is not limited to a multilayer ceramic capacitor including, for example, $BaTiO_3$ (barium titanate) as a main component, and may be, for example, a multilayer ceramic capacitor including another material as a main component or may be another type of capacitor such as an aluminum electrolytic capacitor other than the multilayer ceramic capacitor. The capacitor C1 includes an inductor L3 as a parasitic inductance (equivalent series inductance (ESL)) and is equivalent to a circuit configuration in which the inductor L3 is connected to a capacitor C1*a* in series. Note that, the capacitor C1 may be equivalent to a circuit configuration in which a parasitic resistance (equivalent series resistance (ESR)) is further connected to the inductor L3 and the capacitor C1*a* in series.

The coil L1 and the coil L2, in addition to the capacitor C1, are connected to the electrode 4*c*. The coil L1 and the coil L2 are magnetically coupled to each other and generate a negative inductance component (mutual inductance M). The parasitic inductance (inductor L3) of the capacitor C1 may be canceled using the negative inductance component, and the inductance component of the capacitor C1 may be reduced. In the filter circuit 100 including the capacitor C1, the coil L1, and the coil L2, the parasitic inductance of the capacitor C1 is canceled with the negative inductance component due to the mutual inductance M of the coil L1 and the coil L2. Thus, the noise reduction or prevention effect in a radio frequency range can be increased.

As described above, the circuit device 10A according to Preferred Embodiment 1 includes the substrate 2 on which the wiring pattern is provided and the coil component 1 to be mounted on the substrate 2. The coil component 1 includes the coil L1 (first coil) and the coil L2 (second coil) provided in the multilayer body such that the coil surfaces thereof face each other in the lamination direction. Further, the coil component 1 is mounted such that the coil surfaces thereof are parallel or substantially parallel to the surface of the substrate 2. The wiring pattern includes the land electrode 70 (first electrode portion) and the land electrode 60 (second electrode portion). The land electrode 70 is provided along the second side surface of the multilayer body 3 on which the electrode 4*b* is provided and is connected to the electrode 4*b* (input terminal) of the coil component 1. The land electrode 60 is provided along the first side surface of the multilayer body 3 opposed to the second side surface and is connected to the electrode 4*a* (output terminal) of the coil component 1. Further, the wiring pattern includes the wiring line (first wiring portion) and the wiring line 61 (second wiring portion). The wiring line 71 is electrically connected to the land electrode 70 at a position shifted along the second side surface from the center of the second side surface by the shifting value Y (first distance). The wiring line 61 is electrically connected to the land electrode 60 at a position shifted along the first side surface from the center of the first side surface by the shifting value X (second distance).

With this configuration, in the circuit device 10A according to Preferred Embodiment 1, a current may flow along the side surface of the multilayer body 3 through the land electrode 60 and the wiring line 61, and the land electrode 70 and the wiring line 71. With this, the magnetic field generated by the current flowing through the coil component 1 may be weakened or strengthened by the magnetic field generated by the current flowing through the land electrodes 60 and 70, and the mutual inductance M of the coil component 1 may be adjusted.

The shifting value X and the shifting value Y may be the same or substantially the same as in the circuit devices 10A to 10C. The wiring line 61 and the wiring line 71 may be shifted in the same direction along the side surfaces of the multilayer body 3 as in the circuit devices 10A and 10B. The wiring line 61 and the wiring line 71 may be shifted in different directions along the side surfaces of the multilayer body 3 as in the circuit device 10C. The shifting value X or the shifting value Y may include distance of zero or approximately zero as in the circuit devices 10D and 10E.

The first side surface and the second side surface of the coil component 1 are surfaces parallel or substantially parallel to the longitudinal direction of the coil component 1. Making the first side surface and the second side surface of the coil component 1 parallel or substantially parallel to the longitudinal direction of the coil component 1 allows the land electrodes 60 and 70 to be provided along the longitudinal direction of the coil component 1. Providing the land electrodes 60 and 70 along the longitudinal direction of the coil component 1 makes it possible to elongate the current path of the land electrodes 60 and 70 that may affect the current flowing through the coil component 1, in comparison with the case that the land electrodes 60 and 70 are provided along the lateral direction of the coil component 1.

It is preferable that the coil component 1 is a transformer coil in which the coil L1 and the coil L2 are magnetically coupled to each other. It is preferable that in the coil component 1, the first wiring pattern 10 to the third wiring pattern 30 (conductors) of the coil L1 and the coil L2 include respective portions running along the first side surface and the second side surface.

The filter circuit 100 includes the circuit device 10A, 10B, 10C, 10D, or 10E and the capacitor C1 connected to the electrode 4*c* between the coil L1 and the coil L2 of the coil component 1. With this, in the filter circuit 100, the parasitic inductance of the capacitor C1 is canceled, and the noise reduction or prevention effect in a radio frequency range may be increased.

Preferred Embodiment 2

Figure 7A:
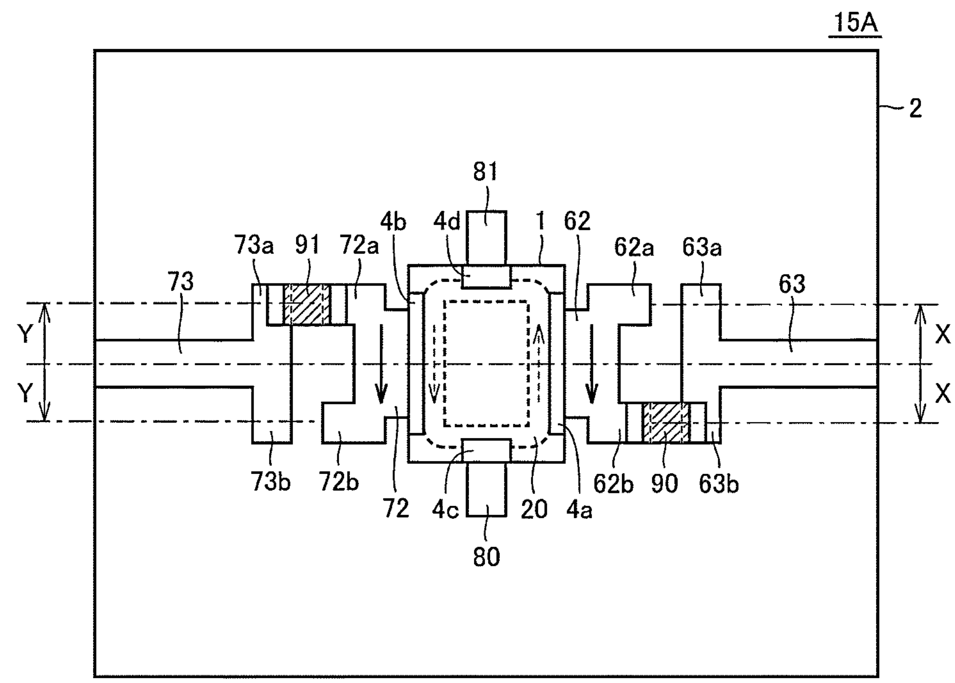
FIGS. 7A and 7B are plan views of a circuit device according to Preferred Embodiment 2 of the present invention.
Figure 7B:
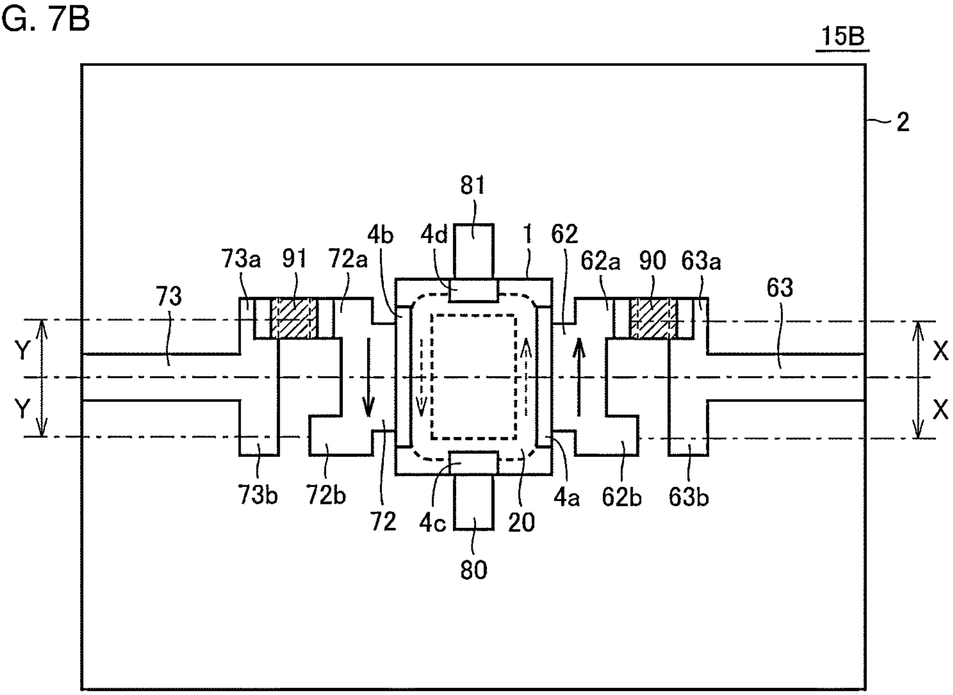

In the circuit device 10A according to Preferred Embodiment 1, the wiring lines 61 and 71 are formed in advance at positions shifted by the shifting value X (first distance) relative to the land electrodes 60 and 70. A circuit device according to Preferred Embodiment 2 of the present invention has a configuration in which a connecting position of a wiring line to a land electrode may be changed at the time of mounting the component. FIGS. 7A and 7B are plan views of the circuit device according to Preferred Embodiment 2. In the circuit device in FIGS. 7A and 7B, the same or corresponding components as those of the circuit device 10A in FIG. 1 are denoted by the same reference signs, and detailed description thereof will not be repeated. Dashed-and-dotted lines in FIGS. 7A and 7B represent the center of the side surface of the coil component 1 and the wiring lines, and a lower side in the drawing is defined as the minus (negative) direction and an upper side in the drawing is defined as the plus (positive) direction.

The coil component 1 is mounted on the surface of the substrate 2 of a circuit device 15A in FIG. 7A. Land electrodes 62 and 72 and the land electrodes 80 and 81 for surface-mounting the coil component 1 are provided on the surface of the substrate 2. The land electrode 62 is connected to the electrode 4*a* that is the output terminal to output a current from the coil component 1, and the land electrode 72 is connected to the electrode 4*b* that is the input terminal to input a current to the coil component 1. Note that, the direction of the current flowing through the coil component 1 may be changed such that the current is inputted through the electrode 4*a* as the input terminal and is outputted through the electrode 4*b* as the output terminal.

The land electrode 62 includes a connection portion 62*a* (1A connection portion) and a connection portion 62*b* (1B connection portion). The connection portion 62*a* is provided at a position shifted in the plus direction from the center of the side surface (first side surface on which the electrode 4*a* is provided) of the coil component 1 by the shifting value X (first distance). The connection portion 62*b* is provided at a position shifted in the minus direction from the center of the side surface of the coil component 1 by the shifting value X. A wiring line 63 includes an end portion 63*a* (1A end portion) extending to the position facing the connection portion 62*a* and an end portion 63*b* (1B end portion) extending to the position facing the connection portion 62*b*. As a result, at the time of mounting the component, it is possible to select whether the connection portion 62*a* and the end portion 63*a* are connected by a connection element 90 (a zero ohm chip, for example) or the connection portion 62*b* and the end portion 63*b* are connected by the connection element 90.

The land electrode 72 includes a connection portion 72*a* (2A connection portion) and a connection portion 72*b* (2B connection portion). The connection portion 72*a* is provided at a position shifted in the plus direction from the center of the side surface of the coil component 1 by the shifting value Y (second distance), and the connection portion 72*b* is provided at a position shifted in the minus direction from the center of the side surface of the coil component 1 by the shifting value Y. A wiring line 73 includes an end portion 73*a* (2A end portion) extending to the position facing the connection portion 72*a* and an end portion 73*b* (2B end portion) extending to the position facing the connection portion 72*b*. As a result, at the time of mounting the component, it is possible to select whether the connection portion 72*a* and the end portion 73*a* are connected by a connection element 91 (a zero ohm chip, for example) or the connection portion 72*b* and the end portion 73*b* are connected by the connection element 91.

In the circuit device 15A in FIG. 7A, the connection element 90 connects the connection portion 62*b* and the end portion 63*b*, and the connection element 91 connects the connection portion 72*a* and the end portion 73*a*. As a result, in the circuit device 15A, the wiring line 63 and the land electrode 62 are connected to each other at a position shifted in the minus direction from the center of the side surface of the coil component 1 by the shifting value X, and a current flowing through the land electrode 62 flows along the side surface of the coil component 1 toward the connection portion 62*b*, as indicated by a solid line arrow in FIG. 7A. Whereas, the current flowing through the coil component 1 flows in the direction opposite or substantially opposite to that of the current flowing through the land electrode 62, as indicated by a dashed line arrow in FIG. 7A. The magnetic field generated by the current flowing through the coil component 1 is weakened by the magnetic field generated by the current flowing through the land electrode 62.

Further, in the circuit device 15A, the wiring line 73 and the land electrode 72 are connected to each other at a position shifted in the plus direction from the center of the side surface of the coil component 1 by the shifting value Y, and a current flowing through the land electrode 72 flows along the side surface of the coil component 1 toward the connection portion 72*b*, as indicated by a solid line arrow in FIG. 7A. Meanwhile, the current flowing through the coil component 1 flows parallel or substantially parallel to the current flowing through the land electrode 72, as indicated by a dashed line arrow in FIG. 7A. The magnetic field generated by the current flowing through the coil component 1 is strengthened by the magnetic field generated by the current flowing through the land electrode 72.

In a circuit device 15B in FIG. 7B, the connection element 90 connects the connection portion 62*a* and the end portion 63*a*, and the connection element 91 connects the connection portion 72*a* and the end portion 73*a*. As a result, in the circuit device 15B, the wiring line 63 and the land electrode 62 are connected to each other at a position shifted in the plus direction from the center of the side surface of the coil component 1 by the shifting value X, and a current flowing through the land electrode 62 flows along the side surface of the coil component 1 toward the connection portion 62*a*, as indicated by a solid line arrow in FIG. 7B. Meanwhile, the current flowing through the coil component 1 flows parallel or substantially parallel to the current flowing through the land electrode 62, as indicated by a broken line arrow in FIG. 7B. The magnetic field generated by the current flowing through the coil component 1 is strengthened by the magnetic field generated by the current flowing through the land electrode 62.

Further, in the circuit device 15B, the wiring line 73 and the land electrode 72 are connected to each other at a position shifted in the plus direction from the center of the side surface of the coil component 1 by the shifting value Y, and a current flowing through the land electrode 72 flows along the side surface of the coil component 1 toward the connection portion 72*b* from the connection portion 72*a*, as indicated by a solid line arrow in FIG. 7B. Meanwhile, the current flowing through the coil component 1 flows parallel or substantially parallel to the current flowing through the land electrode 72, as indicated by a broken line arrow in FIG. 7B. The magnetic field generated by the current flowing through the coil component 1 is strengthened by the magnetic field generated by the current flowing through the land electrode 72.

Figure 8A:
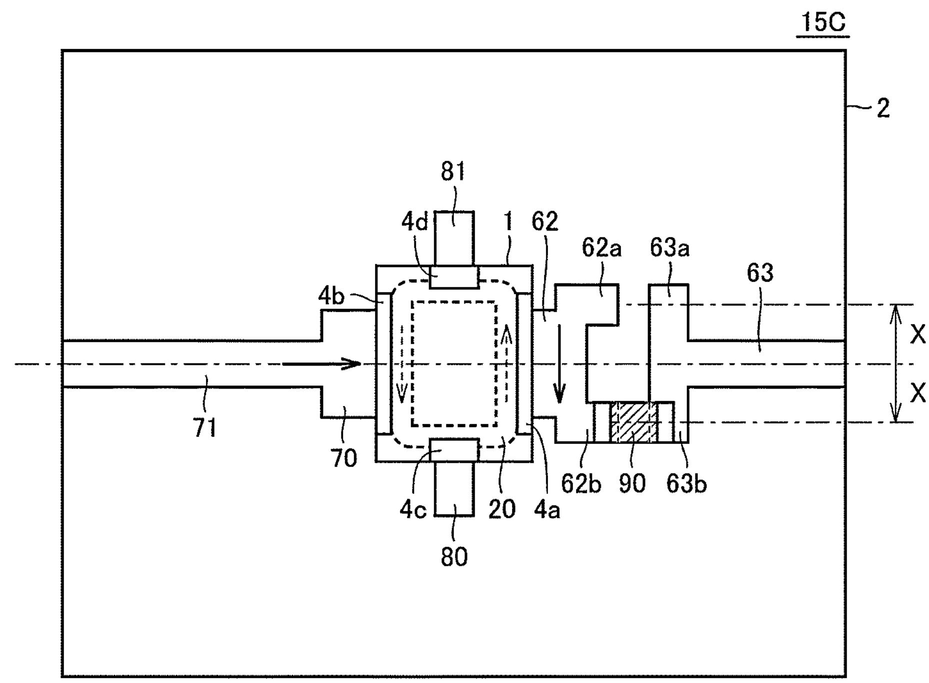
FIGS. 8A and 8B are plan views of another pattern of the circuit device according to Preferred Embodiment 2 of the present invention.
Figure 8B:
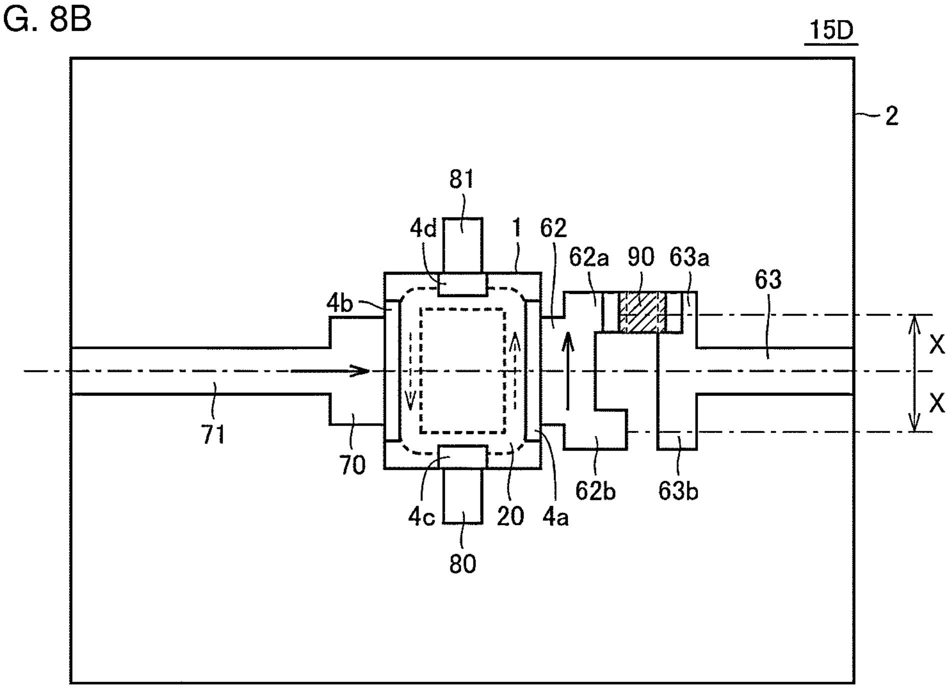

In the circuit device, the shifting value X of the connection portions 62*a* and 62*b* and the shifting value Y of the connection portions 72*a* and 72*b* need not be the same or substantially the same and may be different from each other. Further, the shifting value of the connection portion 62*a* and the shifting value of the connection portion 62*b* need not be the same or substantially the same and may be different from each other. Furthermore, the shifting value of the connection portion 72*a* and the shifting value of the connection portion 72*b* need not be the same or substantially the same and may be different from each other. FIGS. 8A and 8B are plan views of still another pattern of the circuit device according to Preferred Embodiment 2. In circuit devices 15C and 15D in FIGS. 8A and 8B, the land electrode 62 includes the connection portions 62*a* and 62*b* and is connected to the wiring line 63, and the wiring line 71 is connected to the land electrode 70 at the center or approximate center of the side surface of the coil component 1.

In the circuit device 15C in FIG. 8A, the connection element 90 connects the connection portion 62*b* and the end portion 63*b*. In the circuit device 15D in FIG. 8B, the connection element 90 connects the connection portion 62*a* and the end portion 63*a*.

As described above, in the circuit devices 15A and 15B according to Preferred Embodiment 2, the land electrode 62 (first electrode portion) includes the connection portion 62*a* (1A connection portion) and the connection portion 62*b* (1B connection portion). The connection portion 62*a* is provided at a position shifted in the plus direction (first direction) along the first side surface from the center of the first side surface by the shifting value X (first distance). The connection portion 62*b* is provided at a position shifted in the minus direction (second direction) along the first side surface from the center of the first side surface by the shifting value X. The land electrode 72 (second electrode portion) includes the connection portion 72*a* (2A connection portion) and the connection portion 72*b* (2B connection portion). The connection portion 72*a* is provided at a position shifted in the plus direction along the second side surface from the center of the second side surface by the shifting value Y (second distance). The connection portion 72*b* is provided at a position shifted in the minus direction along the second side surface from the center of the second side surface by the shifting value Y. The wiring line 63 (first wiring portion) includes the end portion 63*a* (1A end portion) extending to the position facing the connection portion 62*a* and the end portion 63*b* (1B end portion) extending to the position facing the connection portion 62*b*. The wiring line 73 (second wiring portion) includes the end portion 73*a* (2A end portion) extending to the position facing the connection portion 72*a* and the end portion 73*b* (2B end portion) extending to the position facing the connection portion 72*b*. The circuit devices 15A and 15B include the connection element 90 (first connection element) that electrically connects between the connection portion 62*a* and the end portion 63*a* or between the connection portion 62*b* and the end portion 63*b*, and the connection element 91 (second connection element) that electrically connects between the connection portion 72*a* and the end portion 73*a* or between the connection portion 72*b* and the end portion 73*b*.

With this, in the circuit devices 15A and 15B according to Preferred Embodiment 2, a current may flow along the side surface of the multilayer body 3 through the land electrode 62 and the wiring line 63, and the land electrode 72 and the wiring line 73. With this, the magnetic field generated by the current flowing through the coil component 1 may be weakened or strengthened by the magnetic field generated by the current flowing through the land electrodes 62 and 72. This makes it possible to adjust the mutual inductance M of the coil component 1.

The filter circuit includes the circuit device 15A, 15B, 15C, or 15D and the capacitor C1 connected to the electrode 4*c* between the coil L1 and the coil L2 of the coil component 1. With this, in the filter circuit, the parasitic inductance of the capacitor C1 is canceled, and the noise reduction or prevention effect in a radio frequency range may be increased.

Preferred Embodiment 3

In Preferred Embodiment 2, described is the configuration in which, at the time of mounting the component, the connection element 90 can electrically connect the connection portion 62*a* and the end portion 63*a* or the connection portion 62*b* and the end portion 63*b*, and the connection element 91 can electrically connect the connection portion 72*a* and the end portion 73*a* or the connection portion 72*b* and the end portion 73*b*. In Preferred Embodiment 3 of the present invention, a configuration of a circuit device in which whether or not to include the coil component 1 can be determined at the time of mounting the component will be described.

Figure 9A:
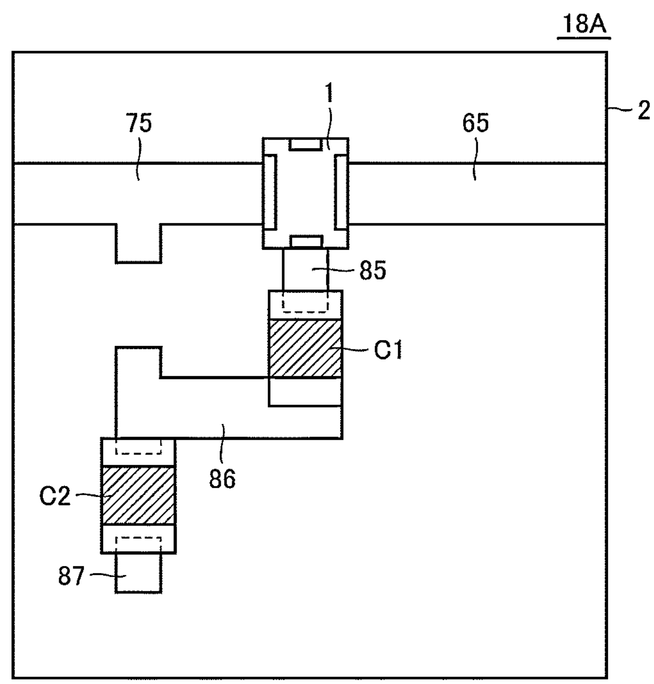
FIGS. 9A and 9B are plan views of a circuit device according to Preferred Embodiment 3 of the present invention.
Figure 9B:
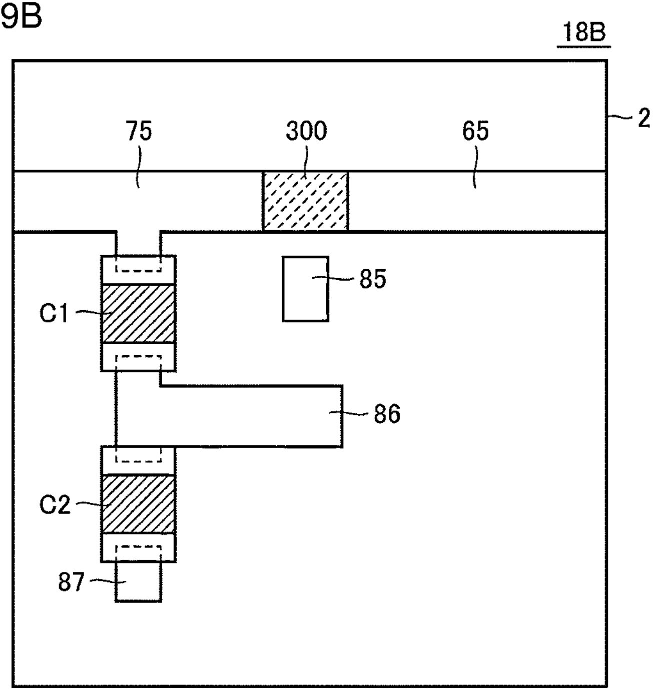

FIGS. 9A and 9B are plan views of the circuit device according to Preferred Embodiment 3. FIG. 9A is a plan view of a circuit device 18A on which the coil component 1 is mounted, and FIG. 9B is a plan view of a circuit device 18B on which the coil component 1 is not mounted. In the circuit device 18A and the circuit device 18B, land electrodes and wiring patterns for mounting the coil component 1, the capacitor C1, a capacitor C2, or the like are identically or substantially identically provided on the surface of the substrate 2.

Specifically, as illustrated in FIG. 9A, the wiring pattern includes wiring lines 65 and 75 to be connected to the input/output terminal of the coil component 1, a land electrode 85 to connect the coil component 1 and the capacitor C1, a wiring line 86 to connect the capacitor C1 and the capacitor C2, and a land electrode 87 to be connected to the capacitor C2.

In the circuit device 18A, as illustrated in FIG. 9A, the coil component 1 is mounted at a position to be connected to the wiring lines 65 and 75 and the land electrode 85. In the circuit device 18A, since the coil component 1 is mounted, the capacitor C1 is mounted at the position to connect the land electrode 85 and the wiring line 86.

Whereas, in the circuit device 18B, since the coil component 1 is not mounted, as illustrated in FIG. 9B, a connection element 300 (a zero ohm chip, for example) to connect the wiring line 65 and the wiring line 75 is mounted. In the circuit device 18B, since the coil component 1 is not mounted, the capacitor C1 is not mounted at the position to connect the land electrode 85 and the wiring line 86, but the capacitor C1 is mounted between the wiring line 75 and the wiring line 86.

As can be seen from FIGS. 9A and 9B, the circuit devices 18A and 18B include the land electrode 85, the wiring line 86, or the like so that the mounting position of the capacitor C1 may be changed depending on whether the coil component 1 is mounted, and the mounting position of the capacitor C2 is not changed.

Figure 10A:
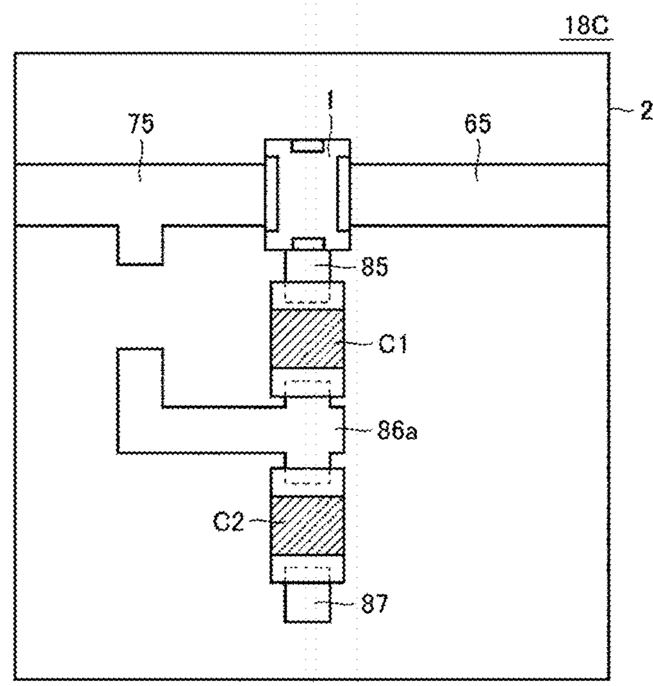
FIGS. 10A and 10B are plan views of another pattern of the circuit device according to Preferred Embodiment 3 of the present invention.
Figure 10B:
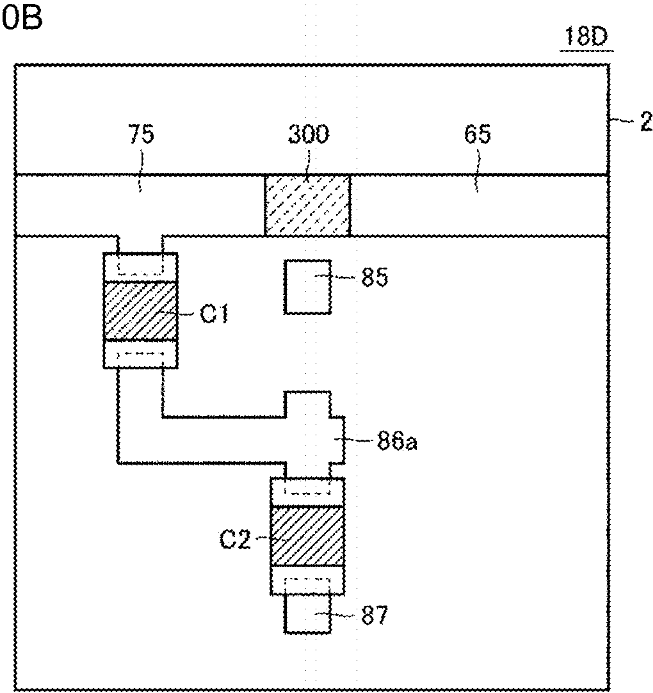

FIGS. 10A and 10B is a plan view of another pattern of the circuit device according to Preferred Embodiment 3. FIG. 10A is a plan view of a circuit device 18C on which the coil component 1 is mounted, and FIG. 10B is a plan view of a circuit device 18D on which the coil component 1 is not mounted. In the circuit device 18C and the circuit device 18D, land electrodes and wiring patterns to mount the coil component 1, the capacitors C1 and C2, or the like are identically or substantially identically provided on the surface of the substrate 2.

The wiring pattern of the circuit device 18C and the circuit device 18D differs from the wiring pattern of the circuit device 18A and the circuit device 18B in the shape of a wiring line 86*a*. In the case of the circuit device 18A and the circuit device 18B, the wiring line 86 has a shape that the capacitor C1 and the capacitor C2 may be mounted on a straight line when the coil component 1 is not mounted. Whereas, in the case of the circuit device 18C and the circuit device 18D, the wiring line 86*a* has a shape that the capacitor C1 and the capacitor C2 may be mounted on a straight or substantially straight line when the coil component 1 is mounted. In the circuit device 18D in FIG. 10B, when the coil component 1 is not mounted, an unnecessary inductance component is generated in the portion of the wiring line 86*a*, and the radio frequency characteristics deteriorate. However, in the circuit device 18A in FIG. 9A, even when an unnecessary inductance component is generated in the portion of the wiring line 86, since the coil component 1 is mounted, the inductance component may be canceled.

Figure 11A:
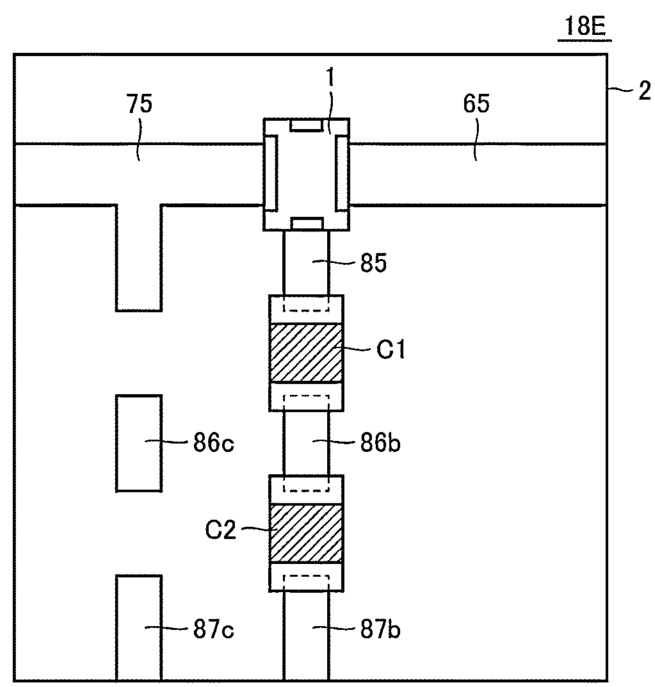
FIGS. 11A and 11B are plan views of the circuit device according to Preferred Embodiment 3 of the present invention and a comparative example.
Figure 11B:
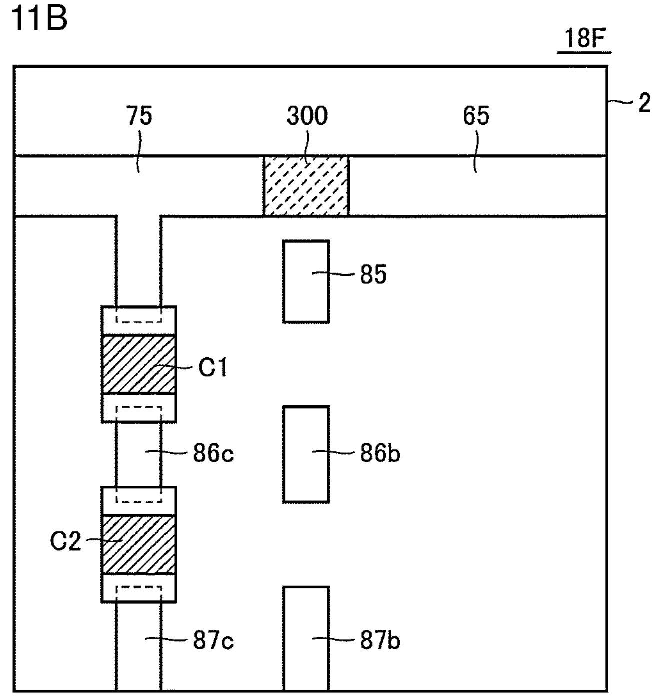

FIGS. 11A and 11B are plan views of a comparative example of the circuit device according to Preferred Embodiment 3. FIG. 11A is a plan view of a circuit device 18E on which the coil component 1 is mounted, and FIG. 11B is a plan view of a circuit device 18F on which the coil component 1 is not mounted. In the circuit device 18E and the circuit device 18F, land electrodes and wiring patterns to mount the coil component 1, the capacitors C1 and C2, or the like are identically or substantially identically provided on the surface of the substrate 2.

Specifically, as illustrated in FIG. 11A, the wiring pattern includes the wiring lines 65 and 75 to be connected to the input/output terminal of the coil component 1, a land electrode 85 to connect the coil component 1 and the capacitor C1, a wiring line 86*b* to connect the capacitor C1 and the capacitor C2, and a land electrode 87*b* to be connected to the capacitor C2.

Further, as illustrated in FIG. 11B, the wiring pattern includes a wiring line 86*c* to connect the capacitor C1 and the capacitor C2 when the coil component 1 is not mounted, and a land electrode 87*c* to be connected to the capacitor C2.

In the circuit devices 18A to 18D in FIGS. 9A and 9B and FIGS. 10A and 10B, the wiring patterns are provided such that the mounting position of the capacitor C2 is not changed depending on whether the coil component 1 is mounted. This makes it possible to reduce the mounting area of the components on the substrate 2, in comparison with the circuit devices 18E and 18F in FIGS. 11A and 11B. In the circuit devices 18A to 18D in FIGS. 9A and 9B and FIGS. 10A and 10B, it is sufficient that a wiring pattern capable of changing only the mounting position of the capacitor C1 is provided on the surface of the substrate 2.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit device, comprising:

a substrate;

a wiring pattern on the substrate; and a coil component on the substrate; wherein the coil component includes:

a first coil and a second coil in a multilayer body such that coil surfaces of the first coil and the second coil face each other in a lamination direction, and the coil component is mounted such that the coil surfaces of the first coil and the second coil are parallel or substantially parallel to a surface of the substrate;

the wiring pattern includes:

a first electrode portion directly connected to an input terminal of the coil component and provided along a first side surface of the multilayer body on which the input terminal is provided;

a second electrode portion directly connected to an output terminal of the coil component and provided along a second side surface of the multilayer body, the second side surface being opposed to the first side surface;

a first wiring portion electrically connected to the first electrode portion at a position along the first side surface from a center of the first side surface by a first distance; and a second wiring portion electrically connected to the second electrode portion at a position along the second side surface from a center of the second side surface by a second distance; and the position along the first side surface is shifted from the center of the first side surface by the first distance, and/or the position along the second side surface is shifted from the center of the second side surface by the second distance.

2. The circuit device according to claim 1, wherein the first distance and the second distance are identical or substantially identical.

3. The circuit device according to claim 1, wherein the first wiring portion and the second wiring portion are shifted in a same direction along the side surfaces of the multilayer body.

4. The circuit device according to claim 1, wherein the first wiring portion and the second wiring portion are shifted in different directions along the side surfaces of the multilayer body.

5. The circuit device according to claim 1, wherein the first side surface and the second side surface of the coil component are surfaces parallel or substantially parallel to a longitudinal direction of the coil component.

6. The circuit device according to claim 1, wherein the coil component includes a transformer coil in which the first coil and the second coil are magnetically coupled to each other.

7. The circuit device according to claim 1, wherein a conductor defining the first coil and the second coil of the coil component includes respective portions running along the first side surface and the second side surface.

8. A filter circuit, comprising:

the circuit device according to claim 1; and a capacitor connected to an electrode between the first coil and the second coil of the coil component.

9. The filter circuit according to claim 8, wherein the first distance and the second distance are identical or substantially identical.

10. The filter circuit according to claim 8, wherein the first wiring portion and the second wiring portion are shifted in a same direction along the side surfaces of the multilayer body.

11. The filter circuit according to claim 8, wherein the first wiring portion and the second wiring portion are shifted in different directions along the side surfaces of the multilayer body.

12. A circuit device, comprising:

a substrate;

a wiring pattern on the substrate; and a coil component on the substrate; wherein the coil component includes:

a first coil and a second coil in a multilayer body such that coil surfaces of the first coil and the second coil face each other in a lamination direction, and the coil component is mounted such that the coil surfaces of the first coil and the second coil are parallel to a surface of the substrate;

the wiring pattern includes:

a first electrode portion connected to an input terminal of the coil component and provided along a first side surface of the multilayer body on which the input terminal is provided;

a second electrode portion connected to an output terminal of the coil component and provided along a second side surface of the multilayer body, the second side surface being opposed to the first side surface;

a first wiring portion not electrically connected to the first electrode portion; and a second wiring portion not electrically connected to the second electrode portion;

the first electrode portion includes:

a first connection portion at a position shifted in a first direction along the first side surface from a center of the first side surface by a first distance; and a second connection portion at a position shifted in a second direction opposite to the first direction along the first side surface from the center of the first side surface by the first distance;

the second electrode portion includes:

a third connection portion at a position shifted in the first direction along the second side surface from a center of the second side surface by a second distance; and a fourth connection portion at a position shifted in the second direction along the second side surface from the center of the second side surface by the second distance;

the first wiring portion includes:

a first end portion extending to a position facing the first connection portion; and a second end portion extending to a position facing the second connection portion; and the second wiring portion includes:

a third end portion extending to a position facing the third connection portion; and a fourth end portion extending to a position facing the fourth connection portion;

a first connection element electrically connects between the first connection portion and the first end portion or between the second connection portion and the second end portion; and a second connection element electrically connects between the third connection portion and the third end portion or between the fourth connection portion and the fourth end portion.

13. The circuit device according to claim 12, wherein a conductor defining the first coil and the second coil of the coil component includes respective portions extending along the first side surface and the second side surface.

14. The circuit device according to claim 12, wherein the first side surface and the second side surface of the coil component are surfaces parallel or substantially parallel to a longitudinal direction of the coil component.

15. The circuit device according to claim 12, wherein the coil component is a transformer coil in which the first coil and the second coil are magnetically coupled to each other.

16. A filter circuit, comprising:

the circuit device according to claim 6; and a capacitor connected to an electrode between the first coil and the second coil of the coil component.

17. The filter circuit according to claim 16, wherein the first side surface and the second side surface of the coil component are surfaces parallel or substantially parallel to a longitudinal direction of the coil component.

18. The filter circuit according to claim 16, wherein the coil component is a transformer coil in which the first coil and the second coil are magnetically coupled to each other.

* * * * *